United States Patent [19]

White, Jr. et al.

[11] 4,344,157
[45] Aug. 10, 1982

[54] ON-CHIP REFRESH ADDRESS GENERATOR FOR DYNAMIC MEMORY

[75] Inventors: Lionel S. White, Jr.; G. R. Mohan Rao, both of Houston, Tex.

[73] Assignee: Texas Instruments Incorporated, Dallas, Tex.

[21] Appl. No.: 135,048

[22] Filed: Mar. 28, 1980

Related U.S. Application Data

[63] Continuation-in-part of Ser. No. 918,891, Jun. 26, 1978, Pat. No. 4,207,618.

[51] Int. Cl.$^3$ ............................................. G11C 7/00
[52] U.S. Cl. .................................................. 365/222
[58] Field of Search ............... 365/205, 222, 239, 240, 365/149

[56] References Cited

U.S. PATENT DOCUMENTS

| | | | |
|---|---|---|---|
| 3,729,722 | 4/1973 | Shuba | 365/222 |
| 3,930,239 | 12/1975 | Salters et al. | 365/240 |
| 4,006,468 | 2/1977 | Webster | 365/222 |
| 4,050,061 | 9/1977 | Kitagawa | 365/222 |
| 4,207,618 | 6/1980 | White et al. | 365/222 |

Primary Examiner—Stuart N. Hecker
Attorney, Agent, or Firm—John G. Graham

[57] ABSTRACT

A semiconductor device comprises an array of rows and columns of dynamic-type memory cells with on-chip refresh address generator circuitry including an address counter or commutator and a multiplexer to insert the refresh address when a command is received or internally generated indicating a refresh cycle. If a refresh command is not being executed, the device is accessed in the usual manner if a memory address is received.

9 Claims, 8 Drawing Figures

ON-CHIP REFRESH ADDRESS GENERATOR FOR DYNAMIC MEMORY

RELATED CASES

This application is a continuation-in-part of our copending application Ser. No. 918,891, filed June 26, 1978, now U.S. Pat. No. 4,207,618, assigned to Texas Instruments, and included subject matter disclosed in pending application Ser. No. 082,371, filed Oct. 5, 1979, by David J. McElroy, assigned to Texas Instruments.

BACKGROUND OF THE INVENTION

This invention relates to semiconductor memory devices and more particularly to a dynamic memory device which functions almost as a static memory device.

The most widely used semiconductor memory devices at present are large scale arrays of one-transistor dynamic memory cells of the type described in U.S. Pat. No. 3,940,747, issued Feb. 24, 1976, to Kuo and Kitagawa, assigned to Texas Instruments. Higher density versions of these memory systems are shown in Electronics, May 13, 1976, pp. 81–86. These high density devices use one transistor dynamic memory cells which have the advantage of very small size, and thus low cost, but have the disadvantage of requiring external refresh systems. Each row of an array of cells must be addressed periodically to restore the data, since the stored voltages will leak off the capacitors in the memory cells. Refresh imposes both time and hardware burdens on the system.

Usually refresh is accomplished by sequentially accessing a bit in a row of a dynamic RAM in either a burst refresh mode where consecutive access cycles are used to refresh all rows, or in a distributed refresh mode where the refresh cycles are distributed over the entire refresh period. In either case, the memory system requires a counter (eight bits long for 256 rows, for example) for the refresh address, a system interrupt mechanism to allow the refresh to occur, and a timer to indicate when refresh should occur, whether burst or distributed mode is used. In a large memory system the overhead circuitry to provide the refresh control is a small part of the system cost, so dynamic RAMs are widely used in medium to large memory systems. However, in small memory systems of the type usually associated with small minicomputers and microprocessors the refresh control circuitry is a significant portion of the system cost, so static RAMs are most often substituted for dynamic RAMs. A single-board microcomputer, for example, may need to use one-third of the board space for refresh control.

The typical static RAM cell requires six transistors, or four transistors and two polysilicon resistors, so the cell size is much greater than the one transistor and one capacitor used in dynamic RAMs. Static cells which provide reduced area are shown in U.S. Pat. No. 4,110,776 issued to Rao et al and assigned to Texas Instruments. Various types of "self-refreshing" cells have been demonstrated, such as in U.S. Pat. Nos. 3,955,181 issued to Joseph H. Raymond, Jr., 4,092,735, 4,139,785 or 4,142,111 issued to David J. McElroy, and U.S. Pat. No. 4,070,653 issued to Rao, Rogers and McElroy, all assigned to Texas Instruments. These self refresh cells provide apparently static operation in that refresh is accomplished without addressing the cells. Still, the cell size and cost per bit have not reached that of dynamic RAMs.

It is a principal object of this invention to provide improved memory systems and devices made in semiconductor integrated circuits. Another object is to provide an improved "static" type MOS memory device, particularly a memory device of small cell size and not requiring elaborate refresh inputs. An additional object is to provide small area pseudo static memory elements in semiconductor integrated circuits, particularly memory devices employing dynamic cell arrays with almost all of the refresh overhead incorporated on the same chip.

SUMMARY OF THE INVENTION

In accordance with an embodiment of this invention, a semiconductor device comprises an array of rows and columns of dynamic-type memory cells with on-chip refresh address generator circuitry including an address counter or commutator and a multiplexer to insert the refresh address when a command is received or internally generated indicating a refresh cycle. If a refresh command is not being executed, the device is accessed in the usual manner if a memory address is received.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

FIGS. 6a–6j and 6'a–6'j are graphic representations of voltage vs. time for electrical waveforms or signals appearing in the system of the embodiment of FIG. 5;

DETAILED DESCRIPTION OF SPECIFIC EMBODIMENT

Figure 1:
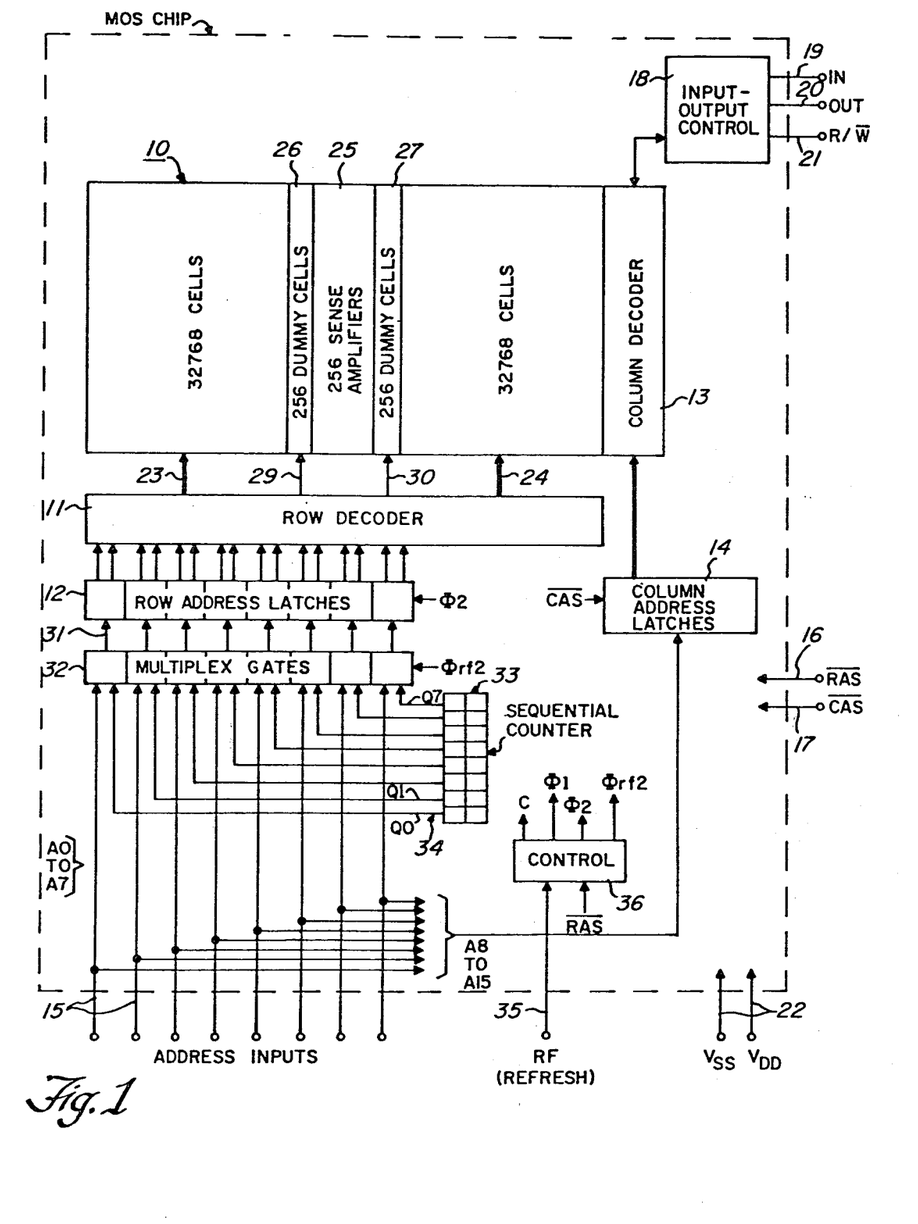
FIG. 1 is an electrical diagram in a block form of a memory device including the on-chip refresh of one embodiment of the invention.
Figure 2:
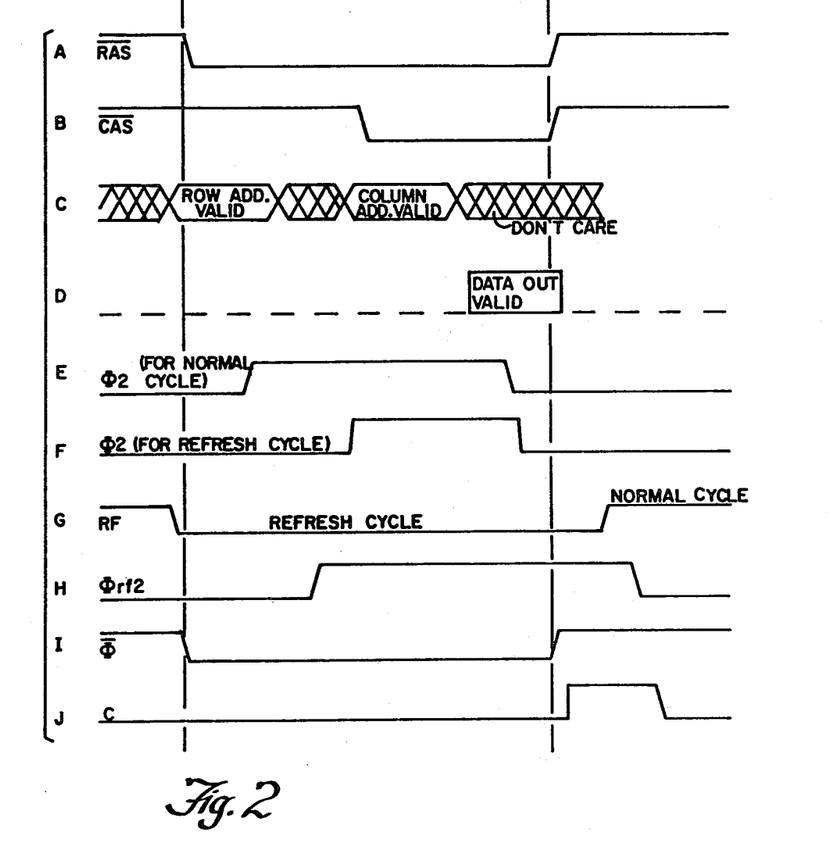
FIGS. 2a–2h are graphic representations of voltage vs. time for electrical waveforms or signals appearing in the system of FIG. 1.

A memory device which may use the invention is shown in FIG. 1. The concept of the invention is particularly useful in very high density memory devices containing, for example, 65,536 or 261,824 cells on one silicon chip of about one-twentieth square inch. This type of device may be made by an N-channel silicon-gate self-aligned MOS process which is described in Electronics, Sept. 28, 1978, pp. 109–116. In this embodiment the device consists of an array 10 of 65,536 one-transistor memory cells generally divided into 256 rows and 256 columns. A row decoder 11 selects one of the 256 row lines as determined by a row or X address contained in an eight-bit row address latch 12, and a column decoder 13 selects one of the 256 column lines as determined by a column or Y address contained in an eight-bit column address latch 14. For normal operation these addresses are applied to the chip by eight address lines 15 on a time-share basis, while for refresh the row address is internally generated. When an $\overline{\text{RAS}}$ or row address strobe input 16 (seen in FIG. 2a) is at logic "0" or zero volts, the row address buffers 12 are enabled at $\Phi 2$ for normal operation to accept row address bits A0 to A7 from the line 15. During a refresh operation, the row address latch accepts a refresh address as will be explained. $\overline{\text{CAS}}$ or column address strobe input 17 (seen in FIG. 2b), when at logic "0" or zero volts, enables the column address buffer 14 to accept a column address (bits A8 to A15) from the lines 15. The row and column addresses must be valid on the pins 15 during the time periods shown in FIGS. 2c. Sixteen address bits are needed to uniquely define one bit of 65,536 cells ($2^{16}=65,536$). Input/output control circuitry 18 may be connected to the array 10 via column decoder 13, and functions to apply data to the column lines from a data input pin 19, or to detect data on the column lines and apply it to a data output pin 20, under control of a read/write R/W input 21 as well as under control of various internally generated clock and logic voltages. Alternatively, a single bidirectional I/O port may be used in place of the separate input and output ports 19 and 20. The device requires supply voltages on pins 22; these usually include a Vdd supply voltage of +5 V. as well as ground or Vss. Of course, some circuits are designed to operate on two or three supply voltages rather than one. The decoder 11 is of conventional design and functions to select one of 128 row lines 23 on the left or one of 128 row lines 24 on the right of a set of 256 sense amplifiers 25. After $\Phi 2$ goes high as seen in FIG. 2e, the selected row line goes to logic "1", and the remaining 255 remain low. The MSB of the row address, A7, selects right or left side and also determines activation of a row of dummy cells 26 or 27 on the opposite side of the sense amplifiers from the selected memory cell, via lines 29 or 30. The sense amplifiers 25 located in the center of each column line are usually bistable circuits as described in detail in U.S. Pat. Nos. 3,940,747; 4,050,061; or 4,081,701.

According to one embodiment of the invention, the row decoder 11 receives at its inputs 31 either a normal address from the input terminals 15 or a refresh address, this selection being made by eight multiplex gates 32. Each of these gates 32 is responsive to a refresh clock of $\Phi$rf2 which causes a gate to apply a refresh address bit Q to the decoder 11. When the clock $\Phi$rf2 is not present, the normal address from the input 15 passes through the eight multiplex gates 32 to the decoder 11. In this embodiment the refresh address is generated in a sequential counter 33 which produces an eight bit address on lines 34; this address sequences through the 256 possible row addresses, one at a time. The address in the sequential counter changes each time an RF signal appears on a chip input pin 35. A control circuit 36 receives the refresh signal RF and an enable signal $\overline{\text{RAS}}$ from pin 16 and produces the $\Phi$rf2 clock as well as other controls.

Figure 3:
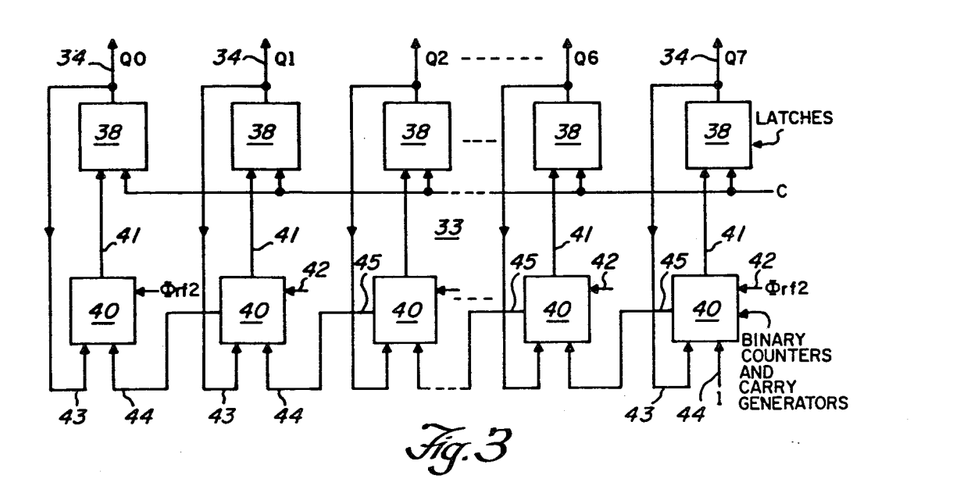
FIG. 3 is an electrical diagram in block form of details of a refresh address counter of the system of FIG. 1.

The rows must be addressed in some sequence, one at a time, so that each of the rows is addressed within the maximum refresh time of the memory device, which may be several milliseconds. The column address is not needed; if a column address is present it is superfluous. Various types of counters which advance one count for each input clock may be used. The address sequence need not advance in order, so long as no address is repeated; thus a pseudo-random shift counter as seen in U.S. Pat. No. 4,074,355 might be used. An example of a counter which advances in regular numerical sequence is seen in FIG. 3. The counter includes eight latches 38 (clocked D type flip flops) which hold the refresh address generated in a series of eight binary adder or counter stages 40. Each adder stage is a standard logic circuit which produces a one or zero on an output 41, when clocked by $\Phi$rf2 at a clock input 42, depending upon binary inputs 43 and 44. Each input 43 is connected to the output 34 of the associated latch 38, and each input 44 is connected to receive a carry output 45 from the preceding stage 40; the input 44 of the first stage 40 is connected to logic "1" so it always has a carry input. The latches 38 can change only if a clock C is present; this clock is generated in the control circuit 36 and occurs at the end of a cycle when the refresh signal RF has occurred and the ordinary chip clock $\overline{\Phi}$ goes to "1". The latches 38 will then receive the address on the lines 41 and will remain in this state until after another refresh signal. When $\Phi$rf2 goes high the counter stages 40 ripple through to the next count before C occurs. When a refresh signal RF occurs, the address applied to the decoder 11 via lines 34 and multiplexers 32 is that which was generated in the counter stages 40 at the previous refresh signal, then stored in the latches 38 after C went high.

Figure 4:
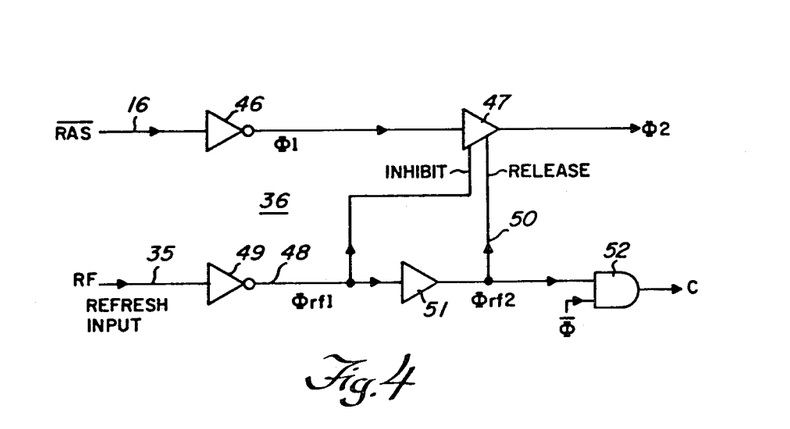
FIG. 4 is an electrical diagram in block form of details of the control circuitry of the system of FIG. 1.

Referring to FIG. 4, the control circuit 38 is shown in detail. The $\Phi 1$ and $\Phi 2$ clocks which are used in the sense amplifiers 25 and at other points in the memory device are generated from the $\overline{\text{RAS}}$ signal on line 16 by an inverter 46 which introduces a slight delay, and a logic gate 47 which introduces further delay. The $\Phi 2$ signal is seen in FIG. 2e. When an RF signal is present on the liine 35, an inhibit signal $\Phi$rf1 is generated on a line 48 by an inverter 49. This inhibits the logic gate 47 from producing $\Phi 2$ until a release signal $\Phi$rf2 occurs on a line 50 at the output of a delay circuit 51. Thus $\Phi 2$ does not occur until slightly after $\Phi$rf2 has triggered the multiplexers 32 to gate in refresh address from the lines 31. The signal $\Phi$rf2 also is applied to a gate 52 along with $\overline{\Phi}$ to produce the refresh clock C.

In the embodiment described above an asynchronous, ripple-through adder is described using the stages 40. As alternatives, a synchronous adder or an adder with a carry look ahead could be used. However, the synchronous adder would either require an on-chip multivibrator to provide the clock signals, or require that multiple memory cycles occur before the next refresh address could be generated. The carry look ahead approach would require considerable additional circuitry and connecting lines.

Figure 5:
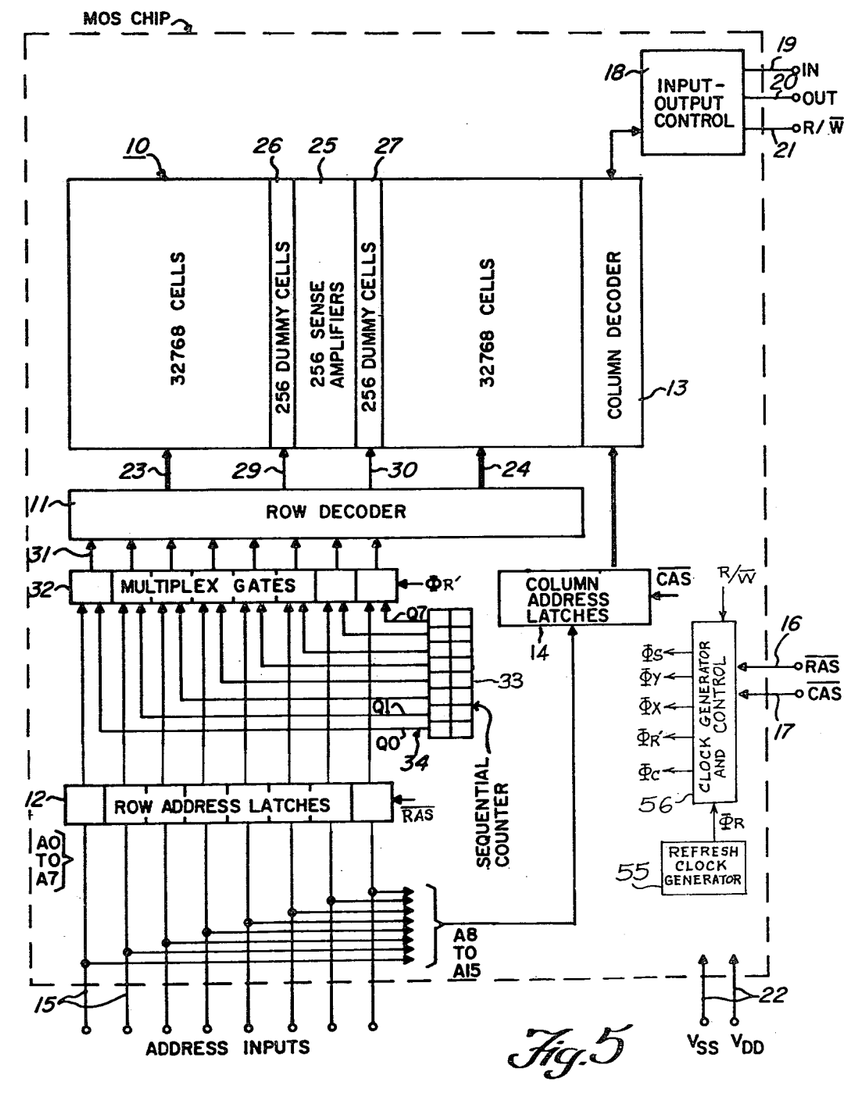
FIG. 5 is an electrical diagram in a block form of a memory device including on-chip refresh according to another embodiment of the invention wherein the refresh operation is invisible to the CPU.

Another embodiment of a memory device which may use the invention is shown in FIG. 5. This device is the same as that of FIG. 1 except that an internal on-chip refresh clock generator 55 is used instead of an off-chip or external RF control 35. As before, for normal operation these addresses are applied to the chip by eight address lines 15 on a time-share basis, while for refresh the row address is internally generated. When an $\overline{\text{RAS}}$ input 16 (seen in FIG. 6a) goes to logic "0", the row address buffers 12 (located prior to the multiplexer 32 in this embodiment) are enabled for normal read or write operation to accept row address bits A0 to A7 (seen in FIG. 6c) from the lines 15. During a refresh operation, no row address input is present as will be explained. When $\overline{CAS}$ input 17 (seen in FIG. 6b) goes to logic "0" the column address buffer 14 is enabled to accept a column address (bits A8 to A15) from the lines 15. The row and column addresses must be valid on the pins 15 during the time periods shown in FIG. 6c. Data input/output seen in FIG. 6g is under control of a read/write command on pin 21 (see FIG. 6i) as well as under control of various internally generated clock and logic voltages. A row select voltage Xw is applied to the selected row line which goes high after $\overline{RAS}$ goes low (FIG. 6d); the remaining 255 row lines remain low. The sense amplifiers are activated by a sense clock ΦS seen in FIG. 6e.

According to this embodiment of the invention, the row decoder 11 receives at inputs 31 either a normal address from the input terminals 15 via the latches 12 or a refresh address, this selection being made by eight multiplex gates 32. These gates 32 are responsive to a refresh clock ΦR' which causes the gates to apply the refresh address bits Q0–Q7 to the decoder 11. When the clock ΦR' is not present, the normal address from the latches 12 passes through the eight multiplex gates 32 to the decoder 11. The refresh address is generated in a sequential counter 33 which produces an eight bit address Q0–Q7 on lines 34 that sequences through the 256 possible row addresses, one at a time. The address in the sequential counter changes each time a refresh clock ΦR' appears; this command ΦR' is derived from ΦR, an output of an on-chip refresh clock generator 55. A control circuit 56 receives the refresh clock ΦR and other signals R/$\overline{W}$, $\overline{RAS}$, $\overline{CAS}$, and produces the ΦR' clock as well as other controls. The counter 33 is the same as described with references to FIG. 3, except ΦR' is used as Φrf2. The control of FIG. 4 is generally the same except the input 35 is from the generator 55.

Figure 6:
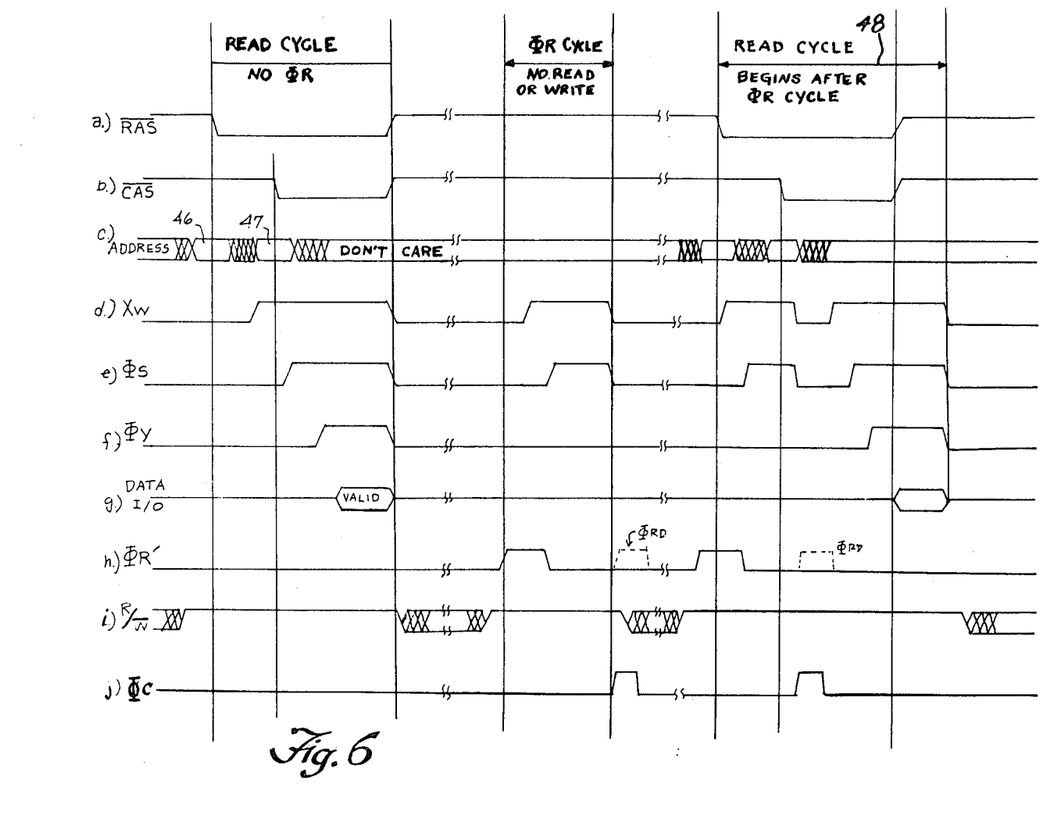

Timing of a normal read cycle with no ΦR occurring is seen at the left of FIG. 6. The R/$\overline{W}$ input 21 is high; the row addresses must be valid on lines 15 during the interval 46 of FIG. 6c. An Xw output, FIG. 6d, from the row decoder 11 occurs next, activating one of the row lines. Meanwhile, the column addresses must be valid at interval 47 of FIG. 6c and are latched in by $\overline{CAS}$. The sense amplifiers are operated by the occurrence of ΦS, FIG. 6e, which drives the column lines to a full logic level. Then the column decoders are activated when ΦY goes high, FIG. 6f, so the bit on the selected column or Y line is coupled to the I/O circuit 18 and causes the output bit on pin 20 to be valid during the time indicated in FIG. 6g.

A refresh cycle with no read or write is seen next in the central part of FIG. 6. Here no $\overline{RAS}$ or $\overline{CAS}$ occurs, so no addresses are latched in, and no ΦY occurs so no data bit is coupled in or out. R/$\overline{W}$ must be high. ΦR' at the input of the multiplexer 32 applies the address from the counter 33 to the row decoder 11, producing an Xw voltage on the selected row line as seen in FIG. 6d, followed by ΦS of FIG. 6e to activate the sense amplifiers and refresh all 256 bits in the selected row.

If a read cycle is initiated after a refresh cycle begins as seen next on the right-hand side of FIG. 6, the refresh cycle is completed then the ready cycle implemented. The row and column addresses are latched in at $\overline{RAS}$ and $\overline{CAS}$ in the usual timing, then held in the latches 12 and 14 while the row addressing using the refresh counter output is completed (FIG. 6d) and a ΦS operation completed. Then another row address is decoded from the latches 12, another Xw occurs (different row selected), followed by another ΦS, FIG. 6e. Thereafter, ΦY and Data Out occur as seen in FIG. 6f and 6g just as in a normal read cycle. The time period 48 for this operation is then the specified "access time" of the device. Data may be available at the output earlier, but if the memory is accessed when refresh is occurring then there is a wait period while the refresh is completed.

A normal write cycle is seen on the left-hand side of FIG. 6'. The R/$\overline{W}$ signal is low, FIG. 6'i, which inhibits generation of ΦR'. The address latching is the same as for a ready cycle. As seen in FIG. 6'g a bit is coupled through the I/O control 18 and into a selected column when ΦY goes high, FIG. 6'f. Then Xw and ΦS occurs, FIGS. 6'd and 6'e, driving the selected column line to full logic level, and causing the bit to be stored in the selected cell, while the other cells in the row are refreshed.

When a write cycle begins after a ΦR' cycle has been started as seen on the right-hand side of FIG. 6', the addresses and data-input must be latched in and held while the refresh operation is completed. Thus, $\overline{RAS}$, $\overline{CAS}$, and row and column addresses (FIGS. 6'a,b,c), occur just as in the normal write operation. ΦY must be delayed so that the data bit won't be written into the row defined by the counter 33 instead of the X address input. So after Xw and ΦS have cycled high/low (refresh) as in FIGS. 6'd and 6'e, ΦY will go high then Xw will reoccur with the new address from the latches 12 and ΦS will reoccur to store the bit in the selected location. The time period 49 for this operation is therefore the specified time for a write cycle to account for the possibility of a write operation being initiated while an internal refresh is occurring.

If the refresh time is 4 ms., the time between ΦR pulses in FIGS. 5 and 6 will be about 15 microsec. If the access time or refresh cycle is about 300 nsec or 0.3 microsec, then the probability of overlap is only about 2%. In addition, a memory device is being accessed only a very small percentage of the total time that a computer is powered up, so statistically the overlapped refresh/read or refresh/write operations 48 or 49 of FIG. 6 occur only once in perhaps 5,000 refresh cycles.

Figure 7:
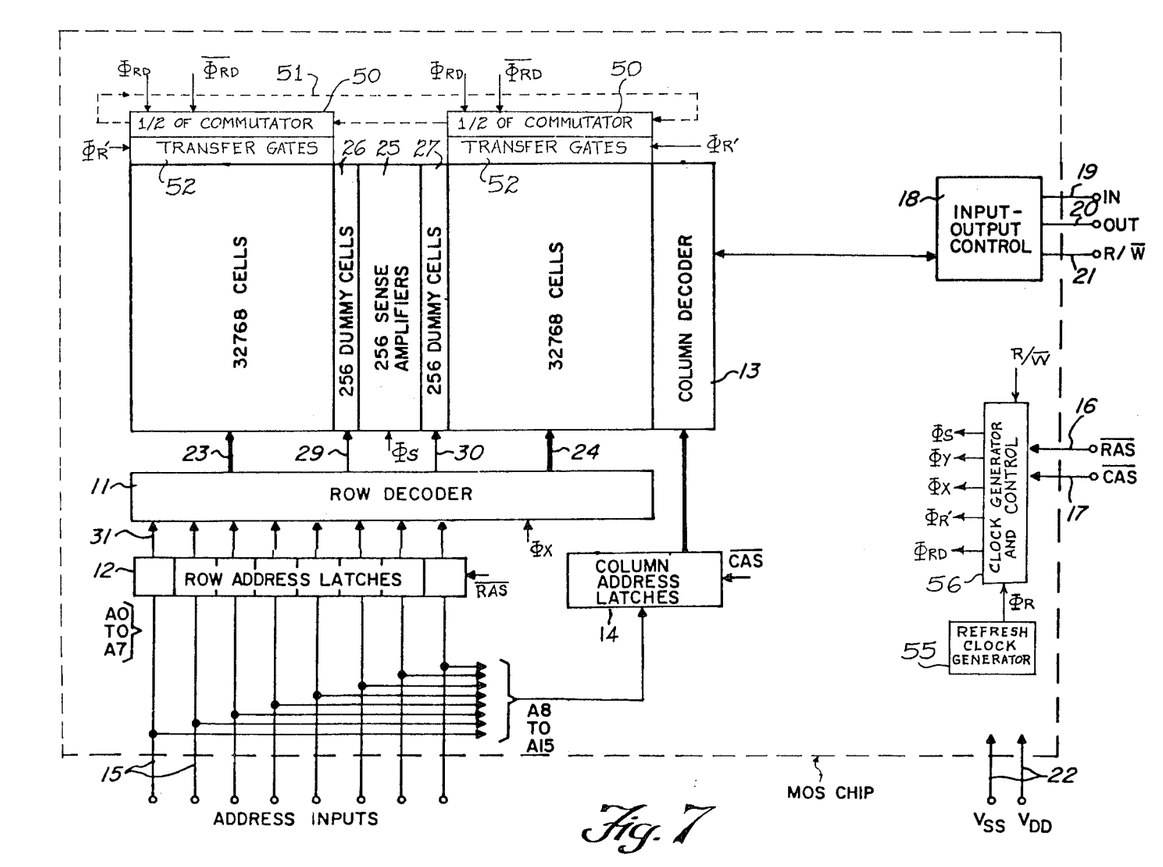
FIG. 7 is an electrical diagram in block form of a memory device according to another embodiment of the invention.

Another embodiment of the invention is shown in FIG. 7, which is in all respects the same as FIG. 5 except that the multiplex gates 32 and the sequuntual counter 33 are not used, but instead a commutator generates the row addresses for refresh. The inputs 31 to the row address decoder 11 are directly from the row address latches 12 as in standard dynamic RAMs for ordinary memory access (read or write) operations. Refresh addresses are generated in a commutator 50 which in this example is a 256 bit serial shift register adapted to continuously circulate a "1" bit, one step for each ΦR' pulse. A feedback loop 51 connects the output of the 256th stage to the input of the first stage. The commutator is constructed to come on at powerup with all stages zero except stage one; this may be done by transistor sizes or by implants. The output of each commutator stage is connected to one of the 256 row lines in the array 10 via 256 transfer gates 52. These gates remain nonconductive until ΦR' occurs which connects an Xw voltage from the stage containing a "1" to the selected row line, thus providing a refresh address. After a short delay, ΦS occurs as seen in FIG. 6e and refresh is implemented. The appropriate dummy cells 26 and 27 are addressed when ΦR' occurs, using standard circuitry (not shown). After ΦR', a delayed refresh pulse ΦRD is generated as seen in FIG. 6h or 6h'; this pulse (and its complement $\overline{\Phi RD}$) is used to advance the shift register commutator 50 after a refresh operation is complete so the next refresh cycle will use the next row. As before, the output repetition rate of the refresh clock generator 55 is selected to cycle the 256 rows within the specified time, taking into account interleaved read or write cycles where refresh is done on an externally addressed row.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A semiconductor memory device comprising an array of rows and columns of memory cells in a single integrated circuit formed in a semiconductor body, the memory cells storing data on capacitors which discharge with time, the memory device having a refresh address counter included within said body for generating row addresses along with means for changing the address in the counter to produce a sequence of row addresses including all of the rows within a refresh period during which said capacitors have not substantially discharged, and the memory device having addressing means for alternatively receiving an address from inputs to the device or from the counter and for accessing the rows of the array using said address.

2. A device according to claim 1 wherein the refresh address counter comprises a plurality of commutator stages with each stage having an output coupled to one of the rows by transfer means.

3. A device according to claim 2 wherein timing clocks are applied to the commutator stages for each refresh cycle and wherein means for delaying the clocks when the addressing means is receiving an address from the inputs.

4. A device according to claim 3 wherein the memory cells are of the one-transistor dynamic type and refresh is provided according to a regular timing sequence dependent upon the refresh time for such cells.

5. A device according to claim 4 wherein the refresh address has a number of stages determined by the number of rows in the array.

6. A device according to claim 5 wherein the memory array has a sense amplifier for each column and timing signals are applied to the sense amplifiers to control sensing operations during access cycles.

7. A method of refreshing a semiconductor memory device of the type having an array of rows and columns of dynamic memory cells in a single integrated circuit formed in a semiconductor body, the memory cells storing bits of data on capacitors which discharge with time, comprising the steps of:
   (a) generating in said integrated circuit row addresses for refresh,
   (b) coupling to the integrated circuit row and column address for access,
   (c) selectively accessing the array with said access addresses or said refresh addresses, and
   (d) periodically changing said refresh addresses whereby all of the rows are accessed within a time period during which there is not substantial discharge of the capacitors.

8. A method according to claim 7 wherein the memory cells are of the one-transistor type and are refreshed by operation of a sense amplifier in the center of each column.

9. A method according to claim 8 wherein the refresh addresses are generated by a commutator having stages coupled separately to each row of cells.

* * * * *